United States Patent
Pollack et al.

(10) Patent No.: US 7,320,813 B2
(45) Date of Patent: Jan. 22, 2008

(54) SYNTHESIS OF HIGHLY CONDUCTING AND TRANSPARENT THIN POLYMER FILMS

(75) Inventors: Steve Pollack, Silver Spring, MD (US); Brett D. Martin, Washington, DC (US); Ranganathan Shashidhar, Woodbridge, VA (US); Yung-Hoon Ha, Springfield, VA (US); Nikolay Nikoloy, Woodbridge, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 97 days.

(21) Appl. No.: 10/735,208

(22) Filed: Dec. 15, 2003

(65) Prior Publication Data

US 2005/0129857 A1 Jun. 16, 2005

(51) Int. Cl.
*B05D 5/12* (2006.01)
(52) U.S. Cl. .................................. 427/240; 427/385.5
(58) Field of Classification Search ............. 427/385.5
See application file for complete search history.

(56) References Cited

U.S. PATENT DOCUMENTS

| | | | |
|---|---|---|---|
| 5,035,926 A | 7/1991 | Jonas et al. | |
| 5,427,841 A * | 6/1995 | De Leeuw et al. | 428/209 |
| 5,447,824 A | 9/1995 | Mutsaers et al. | |
| 5,620,800 A | 4/1997 | De Leeuw et al. | |
| 5,705,888 A * | 1/1998 | Staring et al. | 313/503 |
| 5,766,515 A | 6/1998 | Jonas et al. | |
| 5,792,558 A | 8/1998 | Jonas et al. | |
| 5,914,852 A * | 6/1999 | Hatanaka et al. | 361/523 |
| 5,968,416 A * | 10/1999 | Smith et al. | 252/500 |
| 6,001,281 A * | 12/1999 | Lessner et al. | 252/500 |
| 6,139,778 A * | 10/2000 | Angelopoulos et al. | 252/500 |
| 6,153,725 A * | 11/2000 | Angelopoulos et al. | 528/422 |
| 6,235,827 B1 * | 5/2001 | Kim et al. | 524/403 |
| 6,248,818 B1 | 6/2001 | Kim et al. | |
| 6,867,281 B2 * | 3/2005 | Martin et al. | 528/373 |
| 2002/0077450 A1 * | 6/2002 | Kirchmeyer et al. | 528/373 |

FOREIGN PATENT DOCUMENTS

| | | | |
|---|---|---|---|
| EP | 215257 | * | 9/1994 |
| EP | 615256 | * | 9/1994 |

(Continued)

OTHER PUBLICATIONS

Jonas, Synthetic Metals, 41-43, pp. 831-836, 1991.*

(Continued)

*Primary Examiner*—Erma Cameron
(74) *Attorney, Agent, or Firm*—John J. Karasek; Joseph T. Grunkemeyer

(57) ABSTRACT

A polymerization process is provided using a mixture of a solvent, a monomer, an oxidizing agent, and a moderator. The mixture is coated on a substrate and heated to initiate oxidative polymerization. At least one of three process conditions is used: the solvent having a boiling point in excess of about 120° C.; the total concentration of the monomer, the oxidizing agent, and the moderator being at least about 40% by weight; and the molar concentration of the moderator being greater than the molar concentration of the monomer.

25 Claims, 5 Drawing Sheets

FOREIGN PATENT DOCUMENTS

WO       WO 01/20691    *   3/2001

OTHER PUBLICATIONS

Sankaran et al, Macromolecules, 30, pp. 2582-2588, 1997.*
De Leeuw et al, Technical Digest, International Electron Devices Meeting, pp. 293-296, 2002.*
Touwslager et al, Synthetic Metals, 135-136, pp. 53-54, 2003.*
Winther-Jensen et al, Synthetic Metals, 152, pp. 1-4, 2005.*
De Leeuw et al, "Electroplating of conductive polmers for the metallization of insulators", Elsevier Science, 1994, vol. 66, pp. 263-273.
Im et al, "Preparation and Properties of Transparent and Conducting Nylon 6-based Composite Films", Journal of Applied Polymer Science, 1994, vol. 51, pp. 1221-1229.

Kang et al, "Preparation and morphology of electrically conductive and transparent poly(vinylchloride-)polypyrrole composite films", Polymer Bulletin, 1993, vol. 31, pp. 593-599.
Pei et al, "Electrochromic and highly stable poly(3,4-ethylenedioxythiophene) switches between opaque blue-black and transparent sky blue", Polymer Papers, 1994, vol. 35, No. 7, pp. 1347-1351.
Cao et al, "Optical—Quality Transparent Conductive Polyanilene Films", Elsevier Sequoia, 1993, vol. 55-57, pp. 3526-3531.
Kumar, et al, "Conducting Poly(3,4-alkylenedioxythiophene) Derivatives as Fast Electrochromics with High-Contrast Ratios", American Chemical Society, 1998, vol. 10, pp. 896-902.

\* cited by examiner

SYNTHESIS OF HIGHLY CONDUCTING AND TRANSPARENT THIN POLYMER FILMS

BACKGROUND OF THE INVENTION

1. Field of the Invention

The invention relates to the formation of polymer films, including highly conducting and transparent thin polymer films.

2. Description of the Prior Art

Extended π-conjugated conducting oligomers and polymers have unique properties that have impacted diverse technologies, and have resulted in the appearance of new ones. A partial list of current and developing applications includes micro- and nanoscale circuitry, throwaway electronic devices such as plastic electrochromic displays, flexible displays, lightweight storage batteries, corrosion protection coatings, antistatic coatings, bio- and chemical sensors, and military applications such as microwave-absorbing materials. In all of these applications a high degree of polymer transparency in visible wavelengths is either necessary or could represent an additional advantageous trait.

Key properties of π-conjugated conducting oligomers and polymers such as bandgap, dielectric constant, and oxidation potential can be varied over much wider ranges than those of transparent inorganic conductors such as indium tin oxide (ITO) ceramic. This is because of the vast diversity inherent to the organic chemistry of π-conjugated monomers. Other advantages over metals and inorganics include greater plasticity and elasticity, lower mass density, lower coefficient of thermal expansion, greater resistance to chemicals and corrosion, electrochromism, and enhanced power storage capabilities.

As an example of a specific application wherein a highly transparent conducting polymer could have a large impact, one can consider the liquid crystal display devices (LCDs) that are extremely important in current information technology and organic light emitting diodes (OLEDs) under development for next generation displays. In these devices, or in any display device, transparent electrodes are a prime requirement and ITO coated on glass (or more recently, clear plastic) surfaces has generally been used up to now because of its high transparency (~90%), low surface resistance (~70 ohms/sq), and high conductivity (~1000 S/cm). However, the technology is quite expensive and requires high temperature and vacuum treatment. Moreover, the brittleness of the ITO, the non-stoichiometric nature of ITO surfaces, and poor adhesion at the inorganic-organic interface causes serious problems. The deposition of transparent, conductive polymer film on plastic substrates is a highly promising alternative that allows circumvention of these problems.

Because conducting oligomers/polymers are highly conjugated, they are colored both in the neutral undoped (non-conducting) state as well as in the cationic, doped (conducting) state. The development of highly transparent conducting polymer thin films has therefore been challenging. Prior art has centered on three families of conducting polymers, polyaniline (PANI), polypyrrole (PPY), and poly(3,4 alkylenethiophene) (PATP). PANI films formed by spin-coating the polymer onto clear plastic (polyethylene terephthalate or PET) had a surface resistance of 166 ohms/square and a transparency of ca. 82% over the range 475 to 675 nm, but the transparency sharply decreased below 475 nm giving the film a strong yellowish cast (Cao et al., "Optical-Quality Transparent Conductive Polyaniline Films," *Synth. Metals*, 1993, 57, 3526, incorporated herein by reference). Composite films based on transparent Nylon-6 impregnated with PANI had conductivities of $10^{-2}$ S/cm with optical transparencies of 75%. Analogous films impregnated with PPY had conductivities of $10^{-3}$ S/cm, again with optical transparencies of 75% (Im et al., "Preparation and Properties of Transparent and Conducting Nylon 6-Based Composite Films," *J. Appl. Polym. Sci.*, 1994, 51, 1221, incorporated herein by reference). An additional composite film based on polyvinylchloride and PPY had a conductivity of ~20 S/cm with an optical transparency of ~53% (Kang et al., "Preparation and Morphology of Electrically Conductive and Transparent Poly(vinylchloride)-polypyrrole Composite Films," *Polym. Bull.*, 1993, 31, 593, incorporated herein by reference). Similar results were attained using PATPs and their oligomers. For example, a complex of oligo(3,4 ethylenedioxythiophene) and poly(styrene sulfonate) marketed as Baytron P by Bayer Fine and Specialty Chemicals (Leverkusen, GE) yields films with a surface resistance of ~2600 ohms/sq, a conductivity of ~5 S/cm and a transparency of ca. 80% when spin-coated from aqueous solution (Kumar et al., "Conducting Poly(3,4-alkylenedioxythiophene) Derivatives as Fast Electrochromics with High-contrast Ratios," *Chem. Mater.*, 1998, 10, 896, incorporated herein by reference). PATPs with alkylidene groups such as ethylene, propylene, and butylene as well as those containing phenyl and tetradecyl moieties yielded films with modest properties when formed via electropolymerization. For example, poly(3,4 ethylenedioxythiophene) films had a conductivity of 8 S/cm with a transparency of 52% (Jonas et al., U.S. Pat. No. 5,792,558, incorporated herein by reference).

An attractive attribute of the monomeric alkylidenethiophenes is their low oxidation potential (~0.4 V relative to Ag/AgCl) that allows use of mild oxidation agents and results in polymer with high chemical stability. The polymers also have a low band gap (1.5–1.6 eV), causing their absorption $\lambda_{max}$ values to appear at relatively long wavelengths (590 nm for the undoped form and 775 nm for the doped form). The corresponding colors are dark violet and sky blue. The absorption in the doped conducting form is shifted into the infrared region and therefore the polymers become less heavily colored and are more transparent to the human eye. Within this class of conducting polymers, by far the most extensively investigated has been poly(3,4 ethylenedioxythiophene), or PEDOT, the simplest one from the standpoint of chemical structure (FIG. 1).

A polymerization method that is well suited for monomers with low oxidation potential such as PEDOT utilizes an oxidant, iron (III) p-toluenesulfonate, in combination with imidazole as a moderator in an alcohol solvent. At moderately high temperatures (~100° C.) the polymerization occurs very rapidly. If the reactant-containing solution is spin-coated onto a suitable substrate such as plastic or glass and then heated, highly conducting insoluble sky-blue films are formed (De Leeuw et al., "Electroplating of Conductive Polymers for the Metallization of Insulators," *Synth. Metals*, 1994, 66, 263, incorporated by reference) with reported conductivities of 300 S/cm.

The transparency of conducting polymers nominally follows Beer's law (A=εct) where A is the total absorption, ε is the molecular absorption, c is the concentration of the absorbing species, and t is the path length (thickness of the sample). Making thinner films will result in higher transparency, but generally leads to higher resistances. Moreover, the upper limit of transparency is dictated by the material itself due to the molecular absorption for different conducting polymers. Therefore, materials with low molecular absorption and high conductivity are required for the desirable combination of high transparency and low resistance.

SUMMARY OF THE INVENTION

The invention comprises a polymerization process having the steps of: forming a coating of a mixture of a solvent, a monomer, an oxidizing agent, and a moderator on a substrate; and heating the mixture to initiate oxidative polymerization of the monomer; wherein the process comprises one or more process conditions selected from the group consisting of: the solvent having a boiling point in excess of about 120° C.; the total concentration of the monomer, the oxidizing agent, and the moderator being at least about 40% by weight; and the molar concentration of the moderator being greater than the molar concentration of the monomer.

BRIEF DESCRIPTION OF THE DRAWINGS

A more complete appreciation of the invention will be readily obtained by reference to the following Description of the Example Embodiments and the accompanying drawings.

DETAILED DESCRIPTION OF THE EXAMPLE EMBODIMENTS

Figure 1:
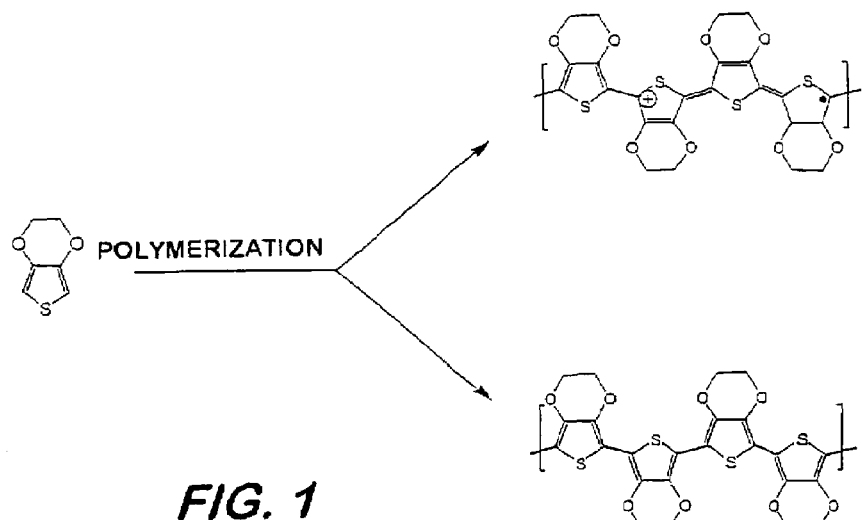
FIG. 1 shows 3,4 ethylenedioxythiophene (EDOT) and its doped (top) and dedoped (bottom) polymeric forms.
Figure 2:
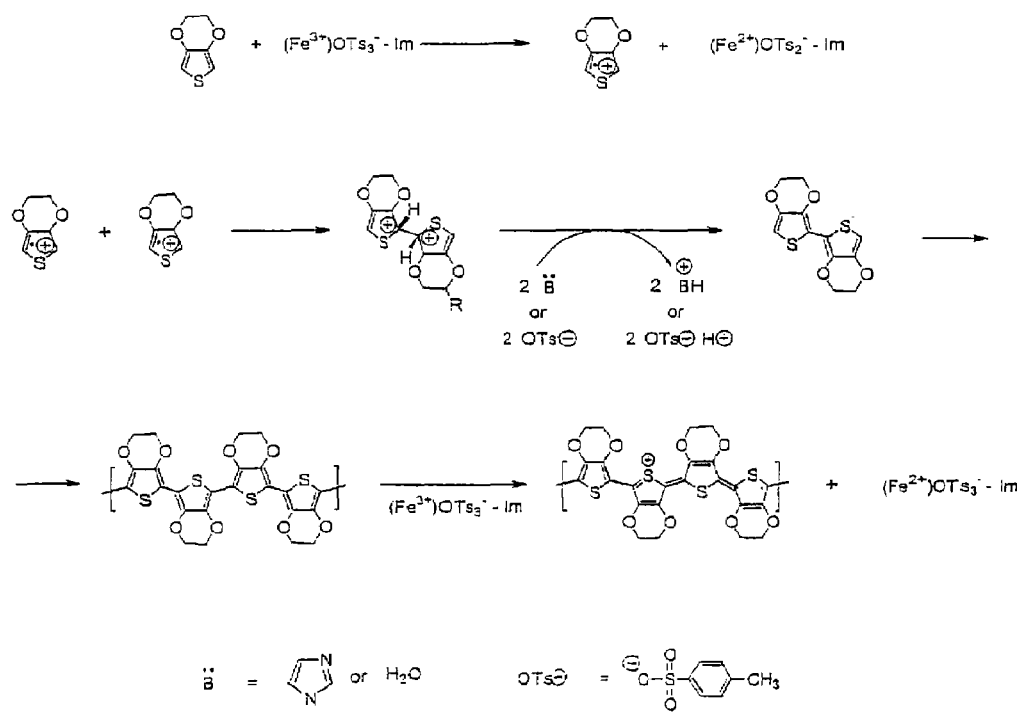
FIG. 2 shows the oxidative polymerization of EDOT.

The oxidative polymerization of EDOT is depicted in FIG. 2. The rate limiting step in this reaction is most likely the redox reaction between the Fe(III) compound and the monomer. Prior work ascribed the influence of an added base to a change in the pH of the reaction media and a concomitant change in the reduction potential of the Fe(III)/Fe(II) couple. However, the present work indicates that the primary action of the amine is to enter the ligand shell around the Fe(III) and form a range of ligand stoichiometries as a function of the FeT:amine ratio. The FeT-amine complex oxidizes the EDOT, transforming it into a cation radical that dimerizes and is rapidly stabilized by base-assisted removal of two protons. This base may be tosylate ion (OTs$^-$) or free amine. Additional FeT-amine complex oxidizes the dimers, and chain growth proceeds as a classical step-polymerization. It also oxidizes the growing chains, leaving the PEDOT in its doped (conducting) state. As such, a higher concentration of FeT should lead to faster polymerization kinetics and higher doping levels, whereas amine acts to retard the polymerization kinetics and lower the doping levels. Although this is believed to be the reaction mechanism, the claimed invention is not limited to this mechanism.

A primary mechanism for simultaneous enhancement of film conductivity and transparency by the imidazole moderator is its ability to minimize polymer grain sizes, leading to greater film contiguity and less light scattering. Using a high-boiling solvent with a high initial reactant concentration to create and maintain a very high film reactant concentration, without film drying, for a relatively long time during heating. At this concentration, chain growth may reach a certain average length that gives the best film properties, while undesirable side-reactions are slowed. Higher-boiling, higher-viscosity solvents would beneficially slow the reaction during the time immediately following the initial mixing of reagents so that smaller, more contiguous film grain sizes will form. General minimization of iron tosylate oxidant would lead to consistent improvements in film properties. The imidazole moderator forms a complex with the iron tosylate oxidant that has an unexpected beneficial behavior. The imidazole lowers the oxidative capacity of the iron atom when it is in its (+3) state while maintaining the reducing capacity of the iron when it is in its (+2) state. This behavior leads to enhanced film properties by preventing the polymer from becoming over-oxidized, which decreases both film conductivity and transparency.

The EDOT polymerization can be improved in one of three ways. One, two, or all three of these methods may be used together. A first embodiment is the use of high-boiling solvents, such as high-boiling alcohols, to induce a pronounced increase in film transparency with little or no decrease in film conductivity. Suitable solvents include, but are not limited to, 2-butanol, 2-methoxy-1-ethanol, 1-pentanol, and 1-hexanol.

Alcoholic solvents with higher boiling points would remain in the sample for a longer time during polymerization at 110° C. and thus should lead to thinner (more transparent) films as the reactant concentration is kept relatively low during polymerization. Alternatively, the viscosity increase observed with higher boiling point solvents may retard polymerization kinetics. This implies a competition between these two factors in the case of lower boiling point solvents—although the polymerization kinetics is faster (which promotes longer chain formation), a high solvent evaporation rate may kinetically trap the polymerization at an early stage.

The higher polymerization kinetics may be balanced by the evaporation rate for different boiling point solvents for the PEDOT. Thus, the conductivity remains constant but the thickness increases with decreasing boiling point solvents. Hydrogen bonding again plays a role for the P(OH-EDOT), decreasing the conductivity with longer chain solvents that prevent efficient packing. The measured surface resistance, transparency, and thicknesses for each PEDOT (boxed) and P(OH-EDOT) (unboxed) sample are included in the figure.

Another interesting feature is that nearly constant conductivities may be observed for all solvents despite the increase in film thickness for samples polymerized with lower boiling point solvents. This suggests that the two competing factors discussed previously are surprisingly balanced. Namely, the thickness is higher in lower boiling point solvents because more EDOT units oligomerized in solution prior to spin-casting and attached to the surface, but the rapid evaporation rate of the solvent kinetically restricted the growing polymers to a certain chain length. This implies that if a higher probability of oligomer formation can be induced at fixed Im:FeT:EDOT ratios, longer polymers should form allowing higher conductivities to be realized.

The effect of an —OH side-group in the monomer poses another interesting variable with regards to the alcoholic solvents employed—the possibility of solvent hydrogen bonding with the P(OH-EDOT). The longer alcoholic chains may hydrogen-bond to the —OH side-groups which frustrates packing during polymerization. Although the solvent eventually evaporates away, the chains are still in a frustrated packing scheme. This prevents efficient overlap between the π-orbitals on neighboring chains, reducing the effective mean conjugation length as the solvent chains become longer and longer.

A second embodiment is the use of very high initial reactant concentrations which may induce a pronounced increase in film conductivity with a minimal decrease in film transparency. The concentration may be at least 40% by weight or at least 60% by weight. Increase in the overall reactant concentration leads to a higher probability (rate) of chain propagation reaction, presumably leading to higher molecular weight chains and to higher conductivities. Additionally, thicker films will result due to higher viscosity, which decreases the transparency according to Beer's Law.

A third embodiment is the use of a higher molar concentration of the moderator than the monomer. The molar concentration of the moderator can be at least about 2 times the molar concentration of the monomer.

It appears that the moderator or imidazole serves three major roles in this system: (1) retarding the polymerization kinetics by reducing the reactivity of FeT either by coordination or lowering of the pH; (2) promoting higher molecular weight polymeric/oligomeric chains, and (3) preventing the polymer from becoming overdoped. Thus, the presence of the imidazole aids in transparency (by decreasing the path length and reducing the surface roughness) and the conductivity (by promoting higher molecular weights and prevent overdoping).

Figure 3:
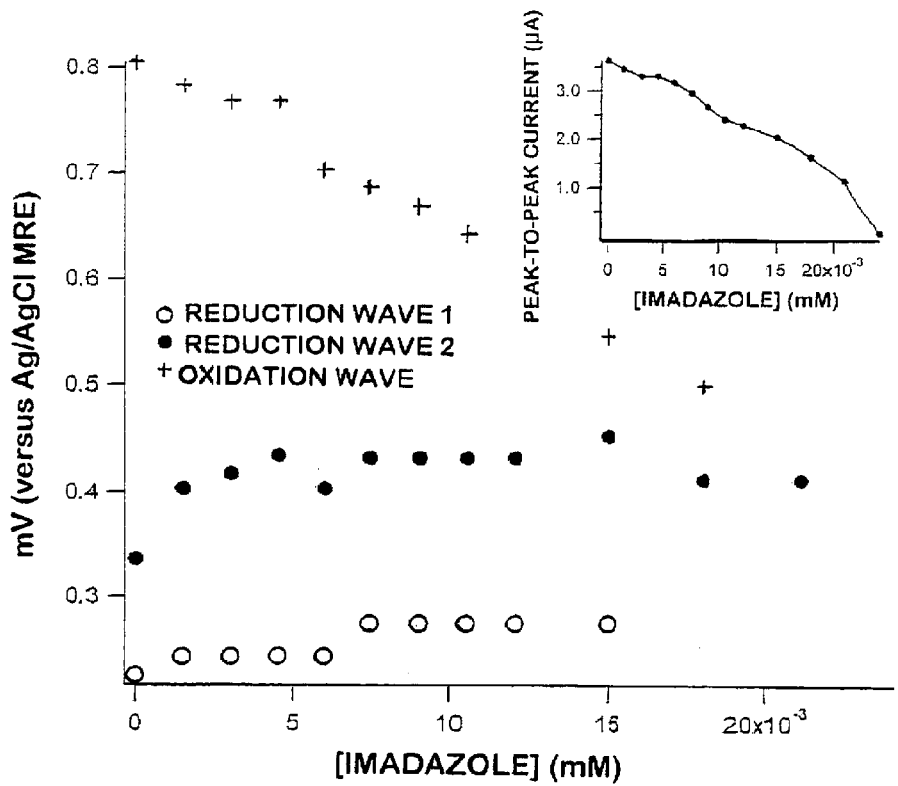
FIG. 3 shows cyclic voltammogram (CV) results showing the oxidation and reduction potentials of Fe(III) (tosylate)$_3$·6H$_2$O as function of added imidazole.

FIG. 3 shows CV results showing the oxidation and reduction potentials of Fe(III) (tosylate)$_3$.6H$_2$O as function of added imidazole. The Fe concentration was 6.61 mM in 0.1 M in LiClO$_4$ in n-Butanol. The inset shows peak-to-peak currents under the same conditions. Imidazole-iron (III) tosylate (FeT) complex formation was detected spectroscopically, exhibiting a $\lambda_{max}$ of 570 nm, vs. 510 nm for free FeT.

This implies that as the Im concentration increases, the reduction of Fe(III), the critical reaction in the polymerization, becomes increasingly more difficult. However, the lowered reactivity may not be purely due to pH changes only. Spectroscopic studies indicate that Im actually coordinates with the FeT as a shift in the absorption peak is observed with increasing Im concentration. Since FeT is initially hydrated, this shift may be due to successive substitution of Im replacing water or alcohol ligands that are initially present. Thus, the lowered reactivity, and thus a decrease in the polymerization kinetics, may not only be due to the pH changes induced by the addition of the base as originally postulated by de Leeuw et al., "Electroplating of Conductive Polymers for the Metallization of Insulators," *Synth. Metals.*, 1994, 66, 263, incorporated herein by reference, but also due to the coordination of FeT with Im around its shell.

This implies that a decrease in polymerization kinetics may arise because Im prefers to quench a monomer radical vs. an oligomeric radical during the polymerization process. This is to be expected since the doped PEDOT radical cations are more delocalized in an oligomeric chain and thus have lower reactivity. This implies that the polymerization kinetics is skewed toward longer chains with increasing Im content, that Im preferentially quenches the monomeric EDOT radicals, and that the longer oligomers couple with each other leading to higher molecular weights. The longer chains allow larger orbital delocalization thus increasing the conductivity, which is demonstrated experimentally. It is important to note that this does not imply the consumption of the imidazole: namely, quenching of the EDOT radicals creates a positively charged imidazole which in turn reduces the Fe(II) into the Fe(III) state, regenerating the initial Im and FeT in the Fe(III) state.

Another significant factor is that the moderation of the Fe(III) activity by the amine likely prevents the chains from becoming overdoped as the FeT not only initiates the polymerization, but also oxidizes the growing chain. Soaking the conductive (doped) film (286 S/cm) in a 2M imidazole solution for 10 minutes does in fact lead to a significant decrease in conductivity (70 S/cm) and the films turn violet, which is indicative of dedoping. Mechanistically, the dedoping reaction must involve electron transfer from Im to the radical cation in the conducting polymer chain. Therefore, Im also acts as a reducing agent with respect to the doped polymer to prevent overdoping, which has important consequences on the conductivity and transparency of the resulting films.

The high reactivity without imidazole has another consequence. It leads to thicker films as oligomers (or polymers) may begin forming in solution prior to spin casting. In fact, the reactivity of the FeT is so high that the polymerization initiates (as evidenced by the change in film color toward bluish hue) within 60 sec even at room temperature after spin casting without the presence of the imidazole. This has a detrimental effect on the transparency, as thicker samples lead to higher absorption and hence lower transparency. Additionally, the excessively fast polymerization kinetics also causes prepolymerized nanoscopic droplets to precipitate onto the substrate, causing high surface roughness. In contrast, the presence of the amine moderator preserves the EDOT in monomeric form after spin casting, and the polymerization at elevated temperature after spin-casting leads to smoother surface morphology with increasing connectivity between the domains, as seen by atomic force microscopy. This not only leads to enhanced conductivity, but also enables achieving a smoother surface morphology, which is particularly important for display devices.

The process can be further improved by spin coating the reaction mixture at high speeds. Suitable spin speeds include, but are not limited to, at least 2000 RPM and at least 6000 RPM.

The process can also be further improved by using a higher molar concentration of the oxidizing agent than the monomer. The ratio of molar concentration can be, but is not limited to, 1.5, 1.75, 2, 3.5, or any ratio in between. These effects may arise from over-oxidation of the polymer. It can be desirable to use the minimal FeT/monomer ratio necessary for polymerization.

Use of these process conditions can produce films or at least 10 S/cm and at least 30% transparency, at least 500 S/cm and at least 70% transparency, and at least 750 S/cm and at least 85% transparency.

Suitable monomers include, but are not limited to, an ethylene dioxythiophene and unsubstituted ethylene dioxythiophene. Ethylene dioxythiophenes can include EDOT derivatives such as those containing an alkane, alkene, alkyne, or aromatic group, or fluorinated or perfluorinated groups, or an ether, ester, hydroxyl, amine, thiol, thione, sulfide, sulfonate, sulfate, phosphine, phosphate, or phosphonate. The work on PEDOT, which involve maximizing the chain length with a controlled level of doping, suggests that PEDOTs that can stay in solution longer before deposition as a film should lead to higher molecular weights and thus higher conductivities. As a test of this hypothesis, studies using the OH-EDOT monomers were carried out.

Suitable oxidizing agents include, but are not limited to, a transition metal salt and iron (III) tosylate (FeT). Suitable moderators include, but are not limited to, a tertiary amine, imidazole, pyridine, and triethyl amine ethylene dioxythiophene.

Having described the invention, the following examples are given to illustrate specific applications of the invention. These specific examples are not intended to limit the scope of the invention described in this application.

Unless specified, all reagents and solvents were purchased from Aldrich Chemical (Milwaukee, Wis.) and used as supplied. The EDOT monomer (Baytron® M, Bayer) was distilled resulting in a clear colorless liquid. Failure to purify the monomer led to inferior materials properties. The alcoholic precursor, 2,3-dihydrothieno [3,4-b][1,4]dioxin-2-yl methanol (OH-EDOT), was synthesized according to Stephan et al, "Electrochemical behaviour of 3,4-ethylenedioxythiophene functionalized by a sulphonate group. Application to the preparation of poly(3,4-ethylenedioxythiophene) having permanent cation-exchange properties," *J. Electroanal. Chem.*, 1998, 443, 217, incorporated herein by reference.

Surface resistances were measured on a four-point probe bench (Signatone SYS-301), calibrated against ITO on plastic reference samples. The thickness of the sample was measured by scanning force microscopy (SPM) (conditions described below) after making a cut on the film surface with a razor blade to expose the glass surface. The average of at least five measured values at different locations of the sample film was utilized for both the surface resistance and thickness values. Conductivity values were obtained by the following relationship:

$$\sigma = \frac{1}{SR \cdot t}$$

where SR is the surface resistance ($\Omega/\square$) and t is the thickness of the film (cm). The transparencies of the films were determined using the absorption spectra obtained using the Cary 4G UV-VIS spectrometer and integrating the curve from 400–700 nm. Transparency through the glass substrate was used as the reference. Spectroscopic studies of the effects of imidazole (Im) addition on the absorption spectra of FeT were also performed on the Cary 4G UV-VIS. Spectra of 1M FeT in n-butanol (1 mL) in a quartz cuvette were initially taken. Spectra were obtained after each sequential addition of a 2M Im solution in n-butanol (50 µL each addition) up to a molar ratio of 0.8:1 Im:FeT.

Electrochemical studies were carried out utilizing a BAS CV-50W Voltammetric Analyzer (Bioanalytical Systems, West Lafayette, Ind.) using a standard three electrode configuration. The working electrode was a freshly polished platinum disk (0.03 sq cm$^2$ active area), the counter electrode was a platinum wire, and the reference electrode was a Ag/AgCl miniaturized reference electrode (MRE) fabricated according to literature procedures. Prior to measurement, the working electrode was polished with alumina, sonicated in deionized water, and rinsed with n-butanol and the reference electrode was conditioned in the electrolyte (0.1 LiClO$_4$ in n-butanol) for ten minutes. Scans were carried out from 1.0 V to 0 and back to 1.0 volts (relative to MRE) at a scan rate of 10 mV/s. The 22.03 mg of FeT (33.03 µmol) was dissolved in 5 mL of the electrolyte. A cyclic voltammogram (CV) was taken of the initial solution and then 50–100 µL aliquots of a 0.15 M solution of Im were added and subsequent CVs obtained.

The surface morphology of the films was obtained with scanning probe microscopy (SPM) using a Digital Instruments Dimensions 3100. Silicon cantilevers oscillating at a resonant frequency of approximately 300 kHz were used in the tapping mode (ΔA/A~40–70%, where A is the free cantilever amplitude and ΔA is the amplitude used for the feedback of the piezo). All images were viewed under height contrast mode showing the surface roughness of the samples.

Selected area diffraction studies were performed on Philips CM30 TEM operating at 300 keV. The samples were spun cast onto glass substrates as discussed previously and placed in a PS Petri dish. Water was filled to form a meniscus with the edge of the glass substrate and dilute HF was dropped into the water. The HF etched the glass at the sample/substrate interface and the film floated on the water surface after a few hours. Samples were collected using a 200 mesh copper grid.

EXAMPLE 1

Series of solvents with increasing boiling points—Six polymer films were synthesized using EDOT monomer solutions in 3 mL alcohol solvent containing 0.50 M iron (III) tosylate, 0.50 M imidazole, and 0.25 M EDOT. The solvents were methanol, 1-propanol, 1-butanol, 2-methoxyethanol, 1-pentanol, and 1-hexanol. The total solute concentrations were 30%. Prior to spin casting, a gradual color change with time (over ~1 hr) was observed in solutions formed from the lower boiling point methanol whereas solutions formed with the higher boiling point pentanol did not exhibit any noticeable color changes. This suggests EDOT oligomerization occurred in the lower viscosity solvents as discussed.

Figure 4:
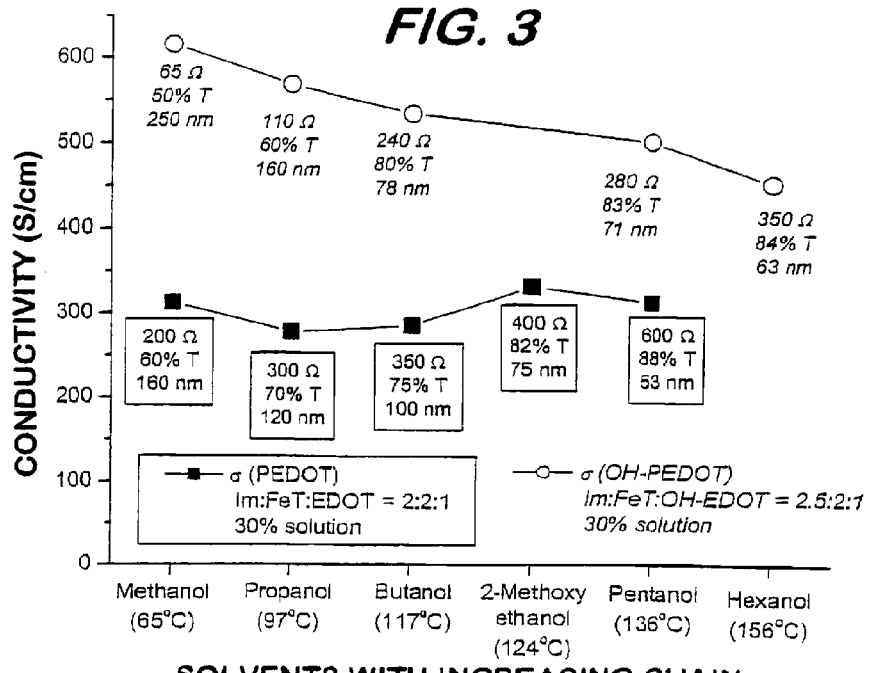
FIG. 4 shows the effect of increasing solvent boiling point on film conductivities and transparencies.

The monomer solution (1.0 mL) was pipetted onto clear plastic (polyethylene terepthalate) 2.5 cm×2.5 cm square substrates having thicknesses of 0.1 mm, or 2.5 cm×2.5 cm glass substrates. The substrates were spin-coated using spin speeds of 1500 RPM. To form the polymer film, the substrates were immediately heated at atmospheric pressure to 110° C. for 3 min. They were then rinsed with methanol, dried with nitrogen gas and their surface resistances and transparency were measured. The film thicknesses were measured using scanning probe microscopy. The results are shown in FIG. 4, which indicates that higher-boiling solvents lead to a substantial increase in film transparency with no decrease in film conductivity. As the solvent boiling point increased by a factor of ~2, film transparency increased by 25% while conductivity remained constant.

In another experiment using OH-EDOT, the solvent was varied fixing the FeT:Im:OH-EDOT molar ratios at 2:2.5:1 at 30% solution concentration. The conductivity decreased with increasing chain length of the solvent (higher boiling point solvents) while the transparency increased (see FIG. 6 open circles).

EXAMPLE 2

Figure 5:
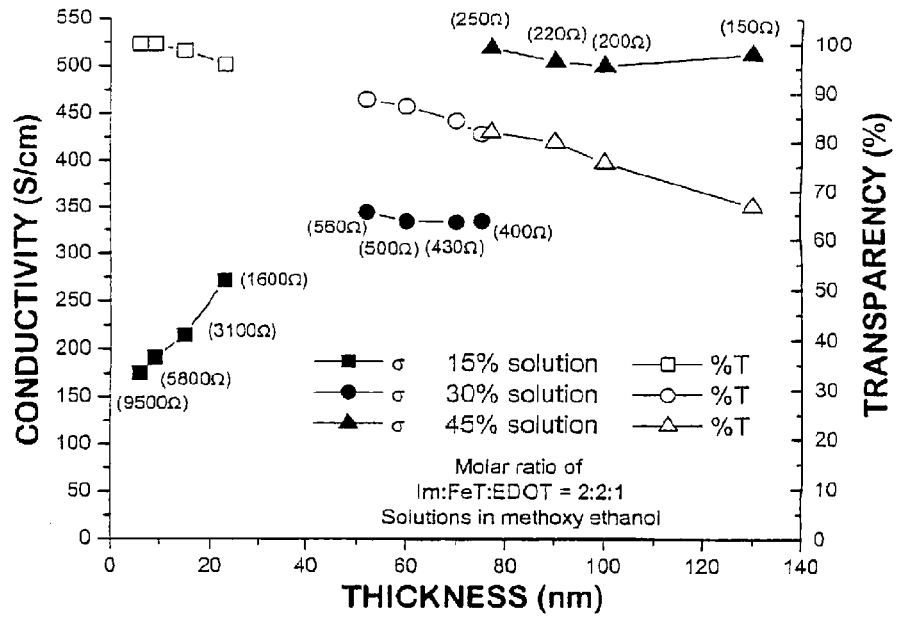
FIG. 5 shows the effect of reactant concentrations on film conductivities and transparencies.

Polymerization at various initial reactant concentrations—Twelve polymer films were formed using EDOT monomer solutions in 2-methoxyethanol containing varying concentrations of reactants. The first set of four films was cast using 0.25 M iron (III) tosylate, 0.25 M imidazole, and 0.125 M EDOT (a 15 wt % solution). The second set was cast using 0.50 M iron (III) tosylate, 0.50 M imidazole, and 0.25 M EDOT (a 30 wt % solution). The third set was cast using 0.75 M iron (III) tosylate, 0.75 M imidazole, and 0.50 M EDOT (a 45 wt % solution). The monomer solutions (1.0 ml) were pipetted onto clear plastic (polyethylene terepthalate) 2.5 cm×2.5 cm square substrates having thicknesses of 0.1 mm or 2.5 cm×2.5 cm glass substrates. The substrates were spin-coated using spin speeds of 1500, 3000, 4500, and 6000 RPM. The substrates were immediately heated at atmospheric pressure to 110° C. for 3 min to form the polymer films. They were then rinsed with methanol, dried with nitrogen gas and their surface resistances and transparency were measured. The film thicknesses were measured using scanning probe microscopy. The results are shown in FIG. 5, which shows that higher reactant concentrations led to substantially higher film conductivities with only a modest drop in transparency. For example, an increase in concentration from 15% to 45% led to a ~2.5-fold increase in film conductivity with only a ~22% decrease in transparency. Also, polymerization at low initial reactant concentrations produced films with very high transparency (98%–99%) and moderate conductivity (180 S/cm–200 S/cm).

The linear relationship of transparency with thickness again confirms that the film absorption follows Beer's Law, i.e. depends on film thickness only. On the other hand, the differences in the observed conductivity can be attributed to the higher molecular weights, as discussed previously, or to a different packing scheme. However, electron diffraction studies on these systems using TEM (not shown) indicate that there is no difference in the packing scheme of the chains due to different solution concentrations. Hence, this confirms that the molecular weight is indeed the dominant factor in improving the conductivity of these materials.

Furthermore, the conductivity most likely follows the classical relationship (low conductivity at very thin films but saturates to a constant value after a finite thickness is reached), and each solution concentration is likely to exhibit a qualitatively similar, but quantitatively different trend.

EXAMPLE 3

Polymerization at various imidazole concentrations—To test for the effect of the weak base, Im concentration was varied fixing the molar ratio of the FeT:EDOT at 2:1. The reactants were dissolved in butanol forming a 30 wt % solution, which was spun cast at 1500 RPM. This was also done using OH-EDOT.

Figure 6:
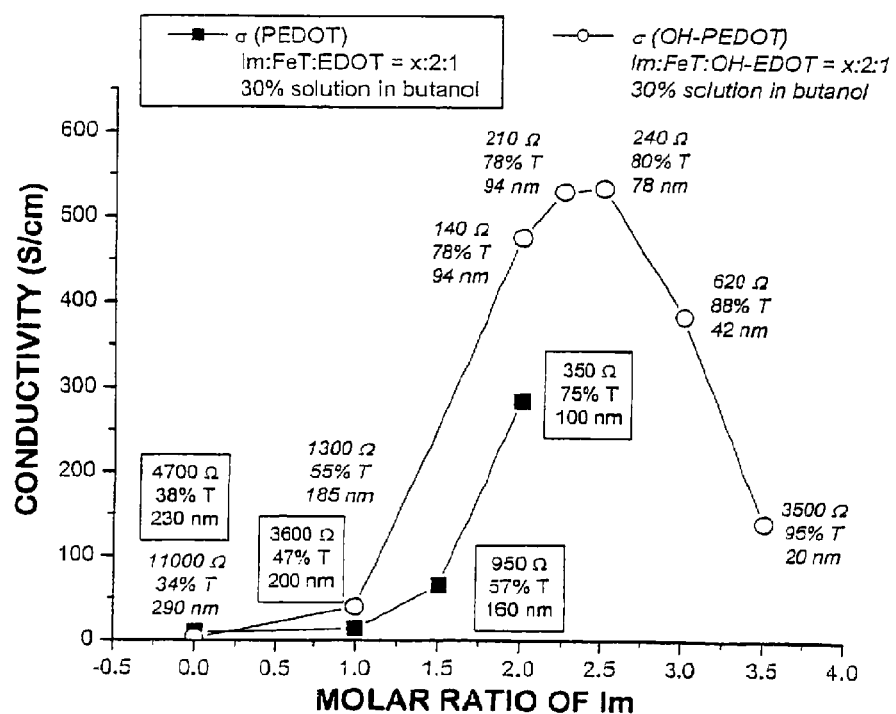
FIG. 6 shows the effect of varying the imidazole/monomer ratio on film conductivities and transparencies.

Increasing the amount of Im led to a dramatic increase in conductivity and transparency (see FIG. 6). Imidazole increased the conductivity of PEDOT (squares), by simultaneously promoting higher molecular weight chains and preventing overdoping. Polymerized PEDOT films do not form when more than ~2.5 molar ratio of Im:EDOT is added.

The conductivity of P(OH-EDOT) (open circles) reached a maximum at 2.5 molar ratio of Im:OH-EDOT as Im probably becomes hydrogen bonded to the P(OH-EDOT) backbone and dedopes the polymer. Data on surface resistance, transparency, and thicknesses for each PEDOT (boxed) and P(OH-EDOT) (unboxed) sample are also included in the figure. These results show that the introduction of an alcoholic side-group allows use of significantly higher Im concentrations as compared to unpolymerized samples of PEDOT when Im molar ratio exceeded 2. Thus, the coordination of the Im with FeT saturates and the excess Im becomes hydrogen bonded to the —OH side-groups in the PEDOT backbone lowering the conductivity as shown. This implies that the P(OH-EDOT) system should be more favorable to dedoping reactions, as some Im may be hydrogen bonded to the backbone. As shown in FIG. 5 (open circles), with Im:OH-EDOT at a 2.5:1 molar ratio and a 30% butanol solution concentration, an increase in the FeT molar concentration leads to a maximum in the conductivity whereas PEDOT conductivities exhibited a linear decrease under these conditions. This is consistent with the argument of Im becoming hydrogen bonded to the P(OH-EDOT), which causes dedoping, but with increasing FeT concentration, the system eventually overdopes again.

EXAMPLE 4

Figure 7:
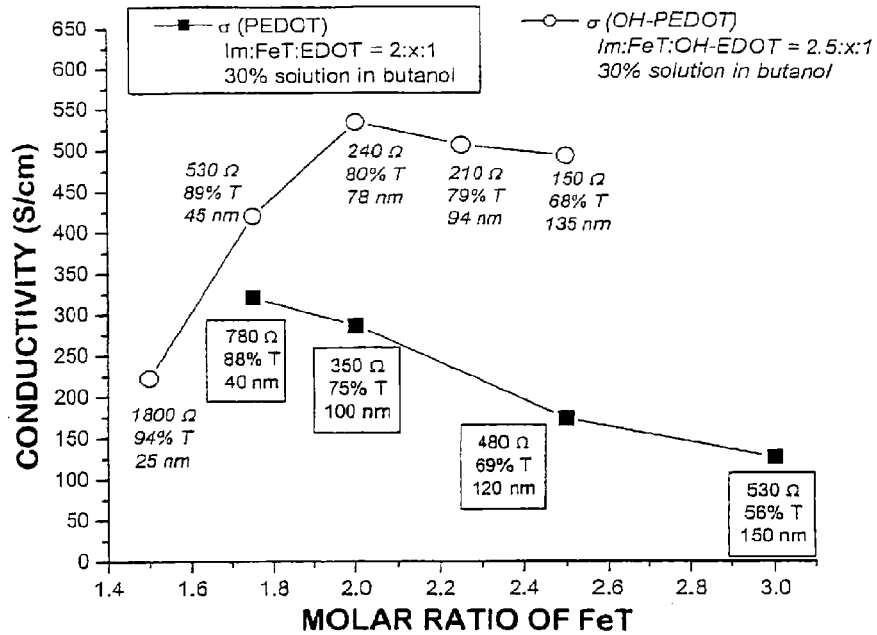
FIG. 7 shows the effect of increasing FeT on film conductivities and transparencies.

Polymerization at various oxidizer concentrations—The FeT concentration was varied fixing the Im:EDOT ratio to 2:1. A 30 wt % butanol solution was employed using a 1500 RPM spin speed. Samples containing 1.5 molar ratio of FeT did not polymerize, potentially due to a sub-stoichiometric quantity of the oxidizing agent or due to the relative excess of the Im which lowers the polymerization reactivity as discussed. Increasing the FeT content led to polymerizable films, and a decrease in conductivity and transparency were observed (see FIG. 7). The conductivity of PEDOT (squares) decreased with higher solution concentration of FeT due to overdoping induced by excess FeT. The conductivity of P(OH-EDOT) (open circles) reached a maximum as hydrogen bonded Im dedoped at low concentrations of FeT, but eventually overdopes with excess FeT. The measured surface resistance, transparency, and thicknesses for each PEDOT (boxed) and P(OH-EDOT) (unboxed) sample are included in the figure. Both of these effects can be attributed to overdoping. The conductivity decrease is probably due to immobilized charge carriers while the transparency decrease is due to thicker film formation caused by faster polymerization kinetics. In addition, the transparency decrease could also be due to a higher number of absorbing moieties as will be illustrated next.

A dedoped sample that had been soaked in imidazole (recall conductivity dropped to 70 S/cm) was soaked in a saturated FeT solution, and the conductivity increased to approximately 130 S/cm with a transparency of 72%, which are both lower than the starting material (280 S/cm and 80% transparency). These experiments confirm that although the FeT is required for polymerization to occur and to dope the growing polymer chains, excess amounts of FeT should be avoided to prevent overdoping which decreases the transparency and the conductivity.

EXAMPLE 5

Figure 8:
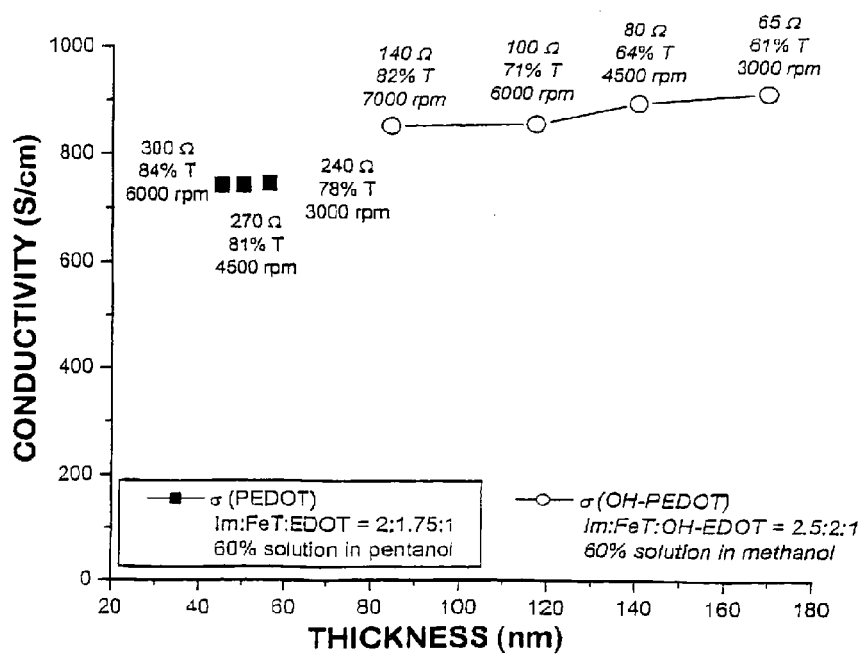
FIG. 8 shows the conductivities and transparencies of high performing films.

Highly conductive and transparent film—Three films were formed using 0.875 M iron (III) tosylate, 1.0 M imidazole, and 0.5 M EDOT at a 60 wt % initial concentration in 1-pentanol, and using spin-coating speeds of 3000 RPM, 4500 RPM, and 6000 RPM. These conditions led to films with conductivities in the range 740–750 S/cm, and transparencies ranging from 78% to 85% (FIG. 8). Another property important in some applications, film surface resistance, was near 250 ohms/square.

The use of OH-EDOT in methanol at 60 wt % initial concentration is also shown in FIG. 8. The conductivity reached nearly 900 S/cm at 60% solution concentration. The —OH functionality may provide a higher solubility of higher molecular weight chains in the alcoholic solvent over the PEDOT before forming a film due to the increased favorable enthalpic interactions.

Figure 9:
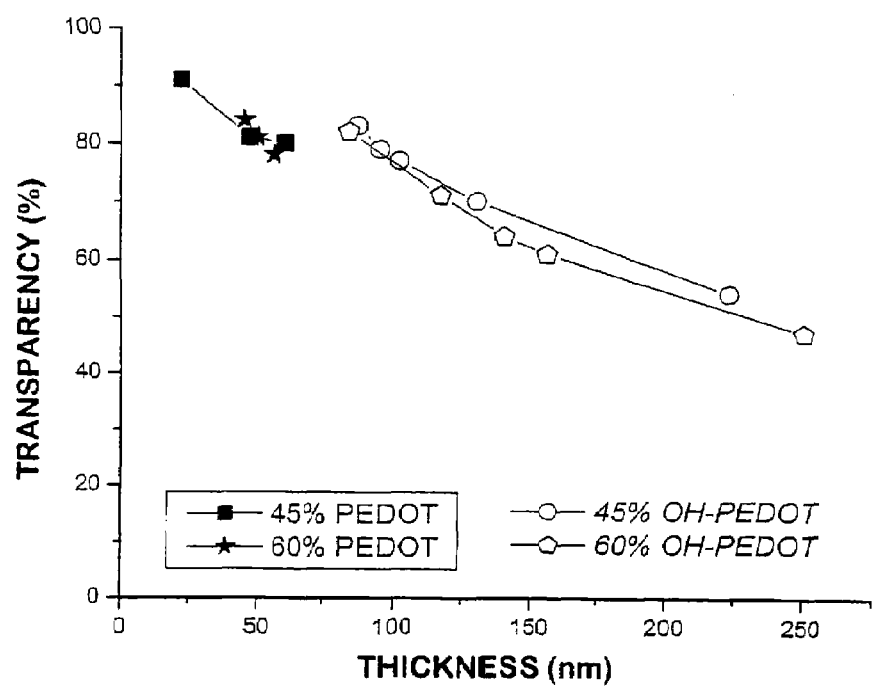
FIG. 9 shows transparency as a function of thickness for PEDOT and P(OH-EDOT).

To illustrate one additional benefit of P(OH-EDOT), extrapolating the lines in FIG. 9 shows that P(OH-EDOT) exhibits higher transparencies than the PEDOT films at a fixed thickness. It appears that the OH side-groups promote either a lower $\epsilon$ (the molecular absorption) or c (the concentration of the absorbing species) as follows from Beer's Law. Nevertheless, P(OH-EDOT) shows a dramatic improvement in the conductivity and the transparency from the bare PEDOT.

Obviously, many modifications and variations of the present invention are possible in light of the above teachings. It is therefore to be understood that the claimed invention may be practiced otherwise than as specifically described.

We claim:

1. A polymerization process having the steps of:
   forming a coating on a substrate, wherein the coating is a mixture of a solvent, a monomer, an oxidizing agent, and a moderator; and
   heating the mixture to initiate oxidative polymerization of the monomer;
   wherein the oxidizing agent and the moderator form a complex; and
   wherein the process comprises the process condition of:
      the total concentration of the monomer, the oxidizing agent, and the moderator being at least about 45% by weight.

2. The process of claim 1, wherein the process further comprises the process conditioin of:
   the solvent having a boiling point in excess of about 120° C.

3. The process of claim 1, wherein the process does not comprise the process conditions of:
   the solvent having a boiling point in excess of about 120° C.; and
   the molar concentration of the moderator being greater than the molar concentration of the monomer.

4. The process of claim 1, wherein the process further comprises the process condition of:
   the molar concentration of the moderator being greater than the molar concentration of the monomer.

5. The process of claim 1, wherein the process further comprises the process condition of:
   the solvent having a boiling point in excess of about 120° C.; and
   the process does not comprise the process condition of:
   the molar concentration of the moderator being greater than the molar concentration of the monomer.

6. The process of claim 1,
   wherein the process further comprises the process condition of the molar concentration of the moderator being greater than the molar concentration of the monomer; and
   wherein the process does not comprise the process condition of the solvent having a boiling point in excess of about 120° C.

7. The process of claim 1,
   wherein the process further comprises the process conditions of:
      the solvent having a boiling point in excess of about 120° C.; and the molar concentration of the moderator being greater than the molar concentration of the monomer.

8. The process of claim 1, further comprising the process condition of:
   the coating being formed by spin-coating at least about 2000 RPM.

9. The process of claim 8, wherein the spin-coating is done at least about 6000 RPM.

10. The process of claim 1, further comprising the process condition of:
    the molar concentration of the oxidizing agent being from about 1.5 to about 3.5 times the molar concentration of the monomer.

11. The process of claim 10, wherein molar concentration of the oxidizing agent is from about 1.75 to about 2 times the molar concentration of the monomer.

12. The process of claim 1, wherein the process conditions are determined such that the resulting polymer has a conductivity of at least about 10 S/cm and a transparency of at least about 30%.

13. The process of claim 12, wherein the polymer has a conductivity of at least about 500 S/cm and a transparency of at least about 70%.

14. The process of claim 12, wherein the polymer has a conductivity of at least about 750 S/cm and a transparency of at least about 85%.

15. The process of claim 1, wherein the solvent is an alcohol.

16. The process of claim 1, wherein the solvent is selected from the group consisting of 2-butanol, 2-methoxy-1-ethanol, 1-pentanol, and 1-hexanol.

17. The process of claim 1, wherein the monomer is polymerized to form a conductive polymer.

18. The process of claim 1, wherein the monomer is an ethylene dioxythiophene.

19. The process of claim 1, wherein the monomer is unsubstituted ethylene dioxythiophene.

20. The process of claim 1, wherein the oxidizing agent is a transition metal salt.

21. The process of claim 1, wherein the oxidizing agent is iron (III) tosylate.

22. The process of claim 1, wherein the moderator is a tertiary amine.

23. The process of claim 1, wherein the moderator is selected from the group consisting of imidazole, pyridine, and triethyl amine.

24. The process of claim 1, wherein the total concentration of the monomer, the oxidizing agent, and the moderator being at least about 60% by weight.

25. The process of claim 1, wherein the molar concentration of the moderator is at least about 2 times the molar concentration of the monomer.

* * * * *